United States Patent [19]
Grigg et al.

[11] Patent Number: 5,981,102
[45] Date of Patent: Nov. 9, 1999

[54] THIN PROFILE BATTERY APPARATUS, BATTERY POWERABLE APPARATUS, RADIO FREQUENCY COMMUNICATION DEVICE, AND METHOD OF FORMING BATTERY POWERABLE APPARATUS

[75] Inventors: Ford B. Grigg, Meridian; Rickie C. Lake, Eagle, both of Id.

[73] Assignee: Micron Communications, Inc., Boise, Id.

[21] Appl. No.: 09/026,249

[22] Filed: Feb. 19, 1998

[51] Int. Cl.$^6$ .............................. H01M 6/42; H01M 2/24; H05K 3/30; H05K 7/02

[52] U.S. Cl. ........................ 429/157; 429/158; 429/162; 29/623.4; 29/831; 29/832; 29/854; 455/572; 361/760

[58] Field of Search ..................................... 429/156–162, 429/9, 99, 149, 127; 455/572–574; 29/623.1, 623.4, 831–836, 840, 841, 854, 855; 361/760, 761

[56] References Cited

U.S. PATENT DOCUMENTS 3,537,909  11/1970  Horton .
5,659,946  8/1997   Harima et al. .
5,804,004  9/1998   Tuckerman et al. ...................... 156/60

OTHER PUBLICATIONS

U.S. application No. 08/705,043, O'Toole et al., filed Aug. 1996.
U.S. application No. 09/026,250, Dando et al., filed Feb. 1998.
U.S. application No. 09/026,247, Trosper, filed Feb. 1998.

Primary Examiner—Maria Nuzzolillo
Assistant Examiner—Jonathan Crepeau
Attorney, Agent, or Firm—Wells, St. John, Roberts, Gregory & Matkin P.S.

[57] ABSTRACT

In accordance with one aspect of the invention, a thin profile battery apparatus comprises at least two thin profile batteries conductively bonded to one another, with one of the batteries including portion which overhangs the other. In one implementation, the batteries comprise button type batteries. In one implementation, the two thin profile batteries are the same size and shape. In accordance with another aspect, a radio frequency communication device comprises a substrate having conductive paths including an antenna. At least one integrated circuit chip is mounted to the substrate and in electrical connection with a first portion of the substrate conductive paths. At least two thin profile batteries conductively bonded in series with and over one another and a second portion of the substrate conductive paths are included. One of the batteries has a portion which overhangs the other and is in electrical connection with a third portion of the substrate conductive paths. In but another aspect, a method of forming a battery powerable apparatus includes providing at least two thin profile batteries over one another. One of the batteries is conductively connected to a first node location formed on a surface of a substrate. The other of the batteries is provided to overhang the one battery and be electrically connected therewith. The overhang of the other battery is conductively connected with a second node location formed on the surface of the substrate.

45 Claims, 4 Drawing Sheets

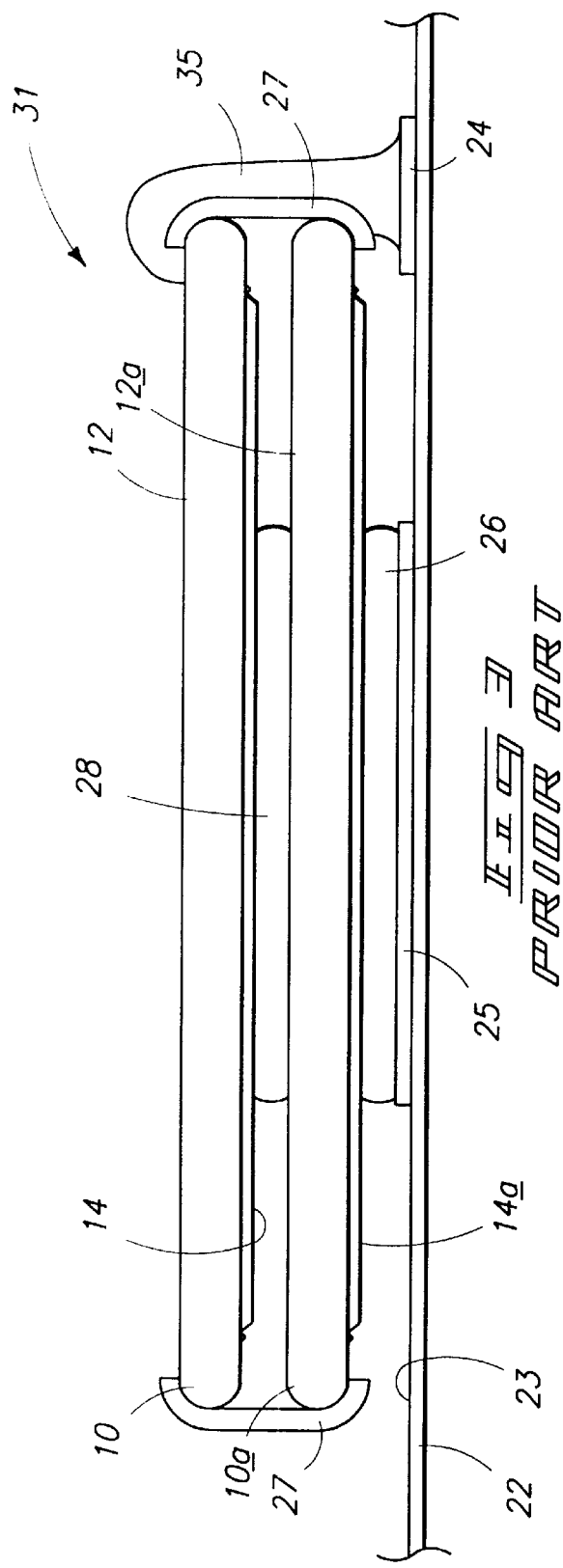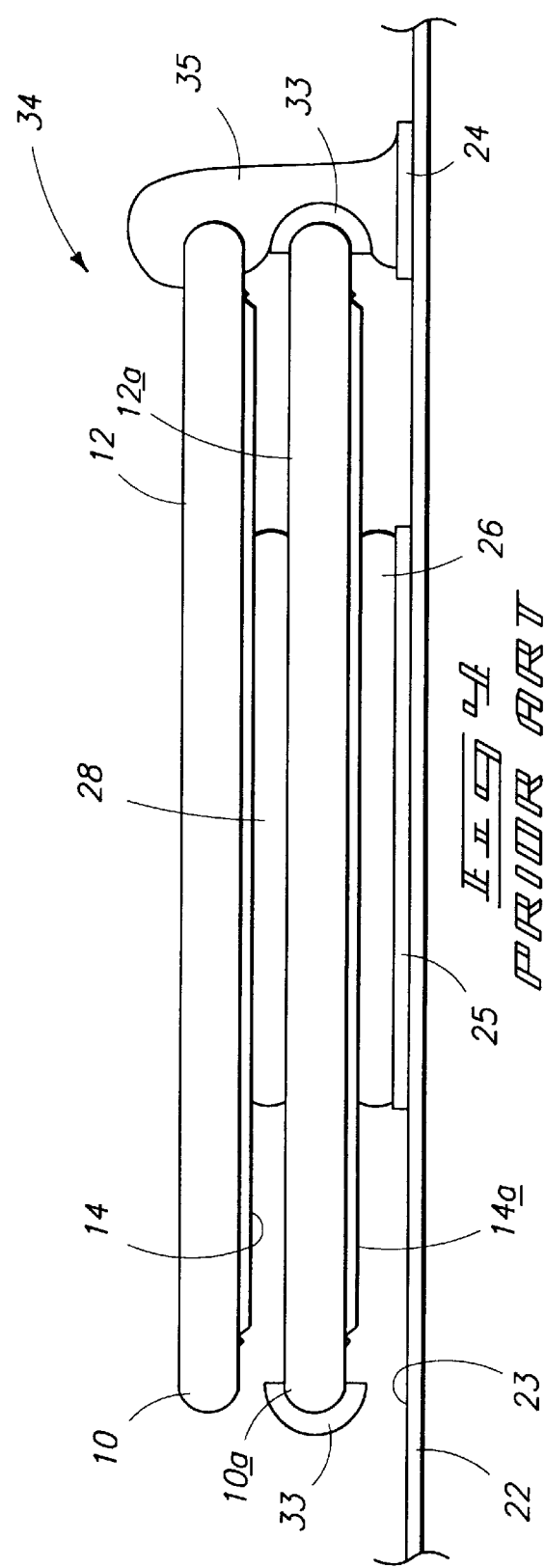

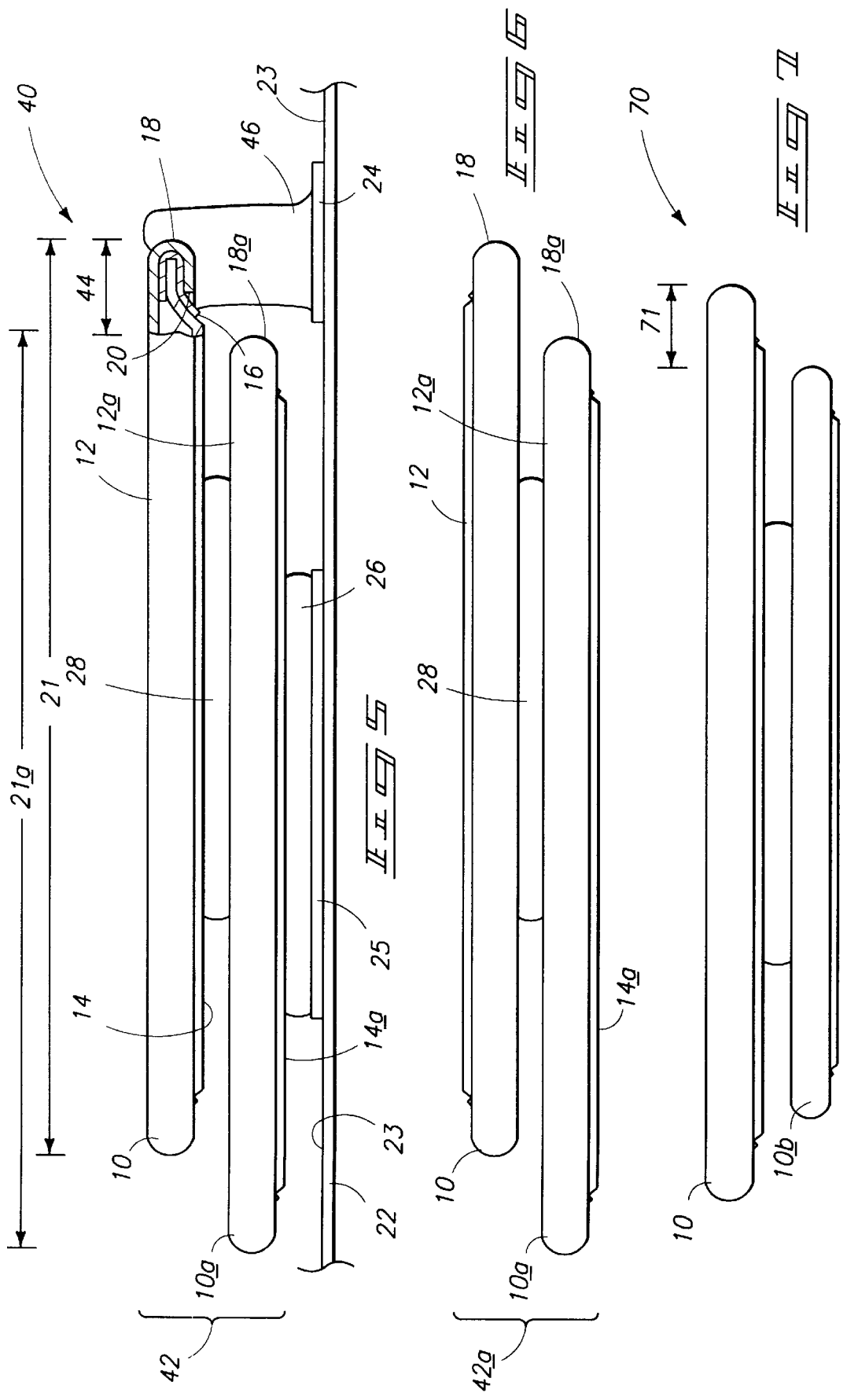

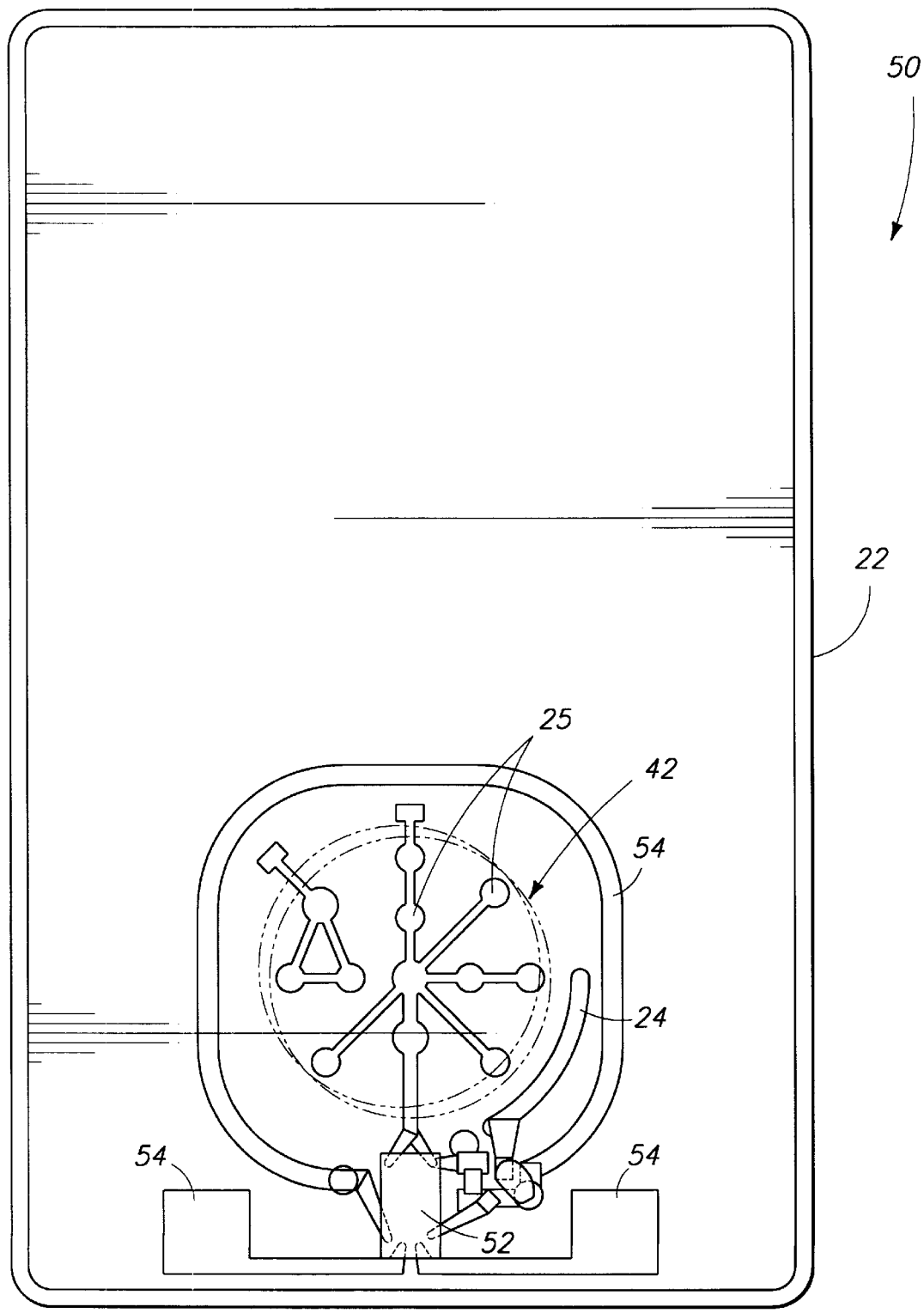

THIN PROFILE BATTERY APPARATUS, BATTERY POWERABLE APPARATUS, RADIO FREQUENCY COMMUNICATION DEVICE, AND METHOD OF FORMING BATTERY POWERABLE APPARATUS

TECHNICAL FIELD

This invention relates to thin profile battery apparatus, battery powerable apparatus, radio frequency communication devices, and methods of forming battery powerable apparatus.

BACKGROUND OF THE INVENTION

Thin profile batteries comprise batteries that have thickness dimensions which are less than a maximum linear dimension of its anode or cathode. One type of thin profile battery is a button type battery. Such batteries, because of their compact size, permit electronic devices to be built which are very small or compact. Yet in some electronic devices it is desirable to provide higher voltages and/or longer battery lifetimes than single thin-profile or button-type batteries permit.

This invention arose out of concerns associated with providing thin profile battery circuits and constructions, and in particular button type battery circuits and constructions which have enhanced power production capabilities and/or battery lifetimes. This invention also arose out of concerns associated with providing circuits and constructions, such as radio frequency communication devices, which utilize more than one battery and which minimize the impact such circuits and constructions have on overall device dimensions. This invention also arose out of concerns associated with providing methods of forming such circuits and constructions.

SUMMARY OF THE INVENTION

In accordance with one aspect of the invention, a thin profile battery apparatus comprises at least two thin profile batteries conductively bonded to one another, with one of the batteries including a portion which overhangs the other. In one implementation, the batteries comprise button type batteries.

In another consideration in accordance with an aspect of the invention, a thin profile battery apparatus includes a first thin profile battery having an edge enveloping periphery and a second thin profile battery having an edge enveloping periphery of substantially the same size and shape as the first thin profile battery edge periphery. The first and second thin profile batteries are electrically connected with one another and mounted one over the other with their edge peripheries not laterally coinciding.

In accordance with but another aspect, a radio frequency communication device comprises a substrate having conductive paths including an antenna. At least one integrated circuit chip is mounted to the substrate and in electrical connection with a first portion of the substrate conductive paths. At least two thin profile batteries conductively bonded in series with and over one another and a second portion of the substrate conductive paths are included. One of the batteries has a portion which overhangs the other and is in electrical connection with a third portion of the substrate conductive paths.

In but another aspect, a method of forming a battery powerable apparatus includes providing at least two thin profile batteries over one another. One of the batteries is conductively connected to a first node location formed on a surface of a substrate. The other of the batteries is provided to overhang the one battery and be electrically connected therewith. The overhang of the other battery is conductively connected with a second node location formed on the surface of the substrate.

BRIEF DESCRIPTION OF THE DRAWINGS

Preferred embodiments of the invention are described below with reference to the following accompanying drawings.

FIG. 3 is a side elevational view of another thin profile battery apparatus operably associated with a battery powerable apparatus, and of the FIG. 2 scale.

FIG. 4 is a side elevational view of another thin profile battery apparatus operably associated with a battery powerable apparatus, and of the FIG. 2 scale.

FIG. 5 is a side elevational view of a thin profile battery apparatus in accordance with the invention operably associated with a battery powerable apparatus in accordance with the invention, and of the FIG. 2 scale.

FIG. 6 is a side elevational view of an alternate embodiment thin profile battery apparatus in accordance with the invention.

FIG. 7 is a side elevational view of another alternate embodiment thin profile battery apparatus in accordance with the invention.

FIG. 8 is a diagrammatic plan view of a radio frequency communication device in accordance with the invention.

DETAILED DESCRIPTION OF THE PREFERRED EMBODIMENTS

Figures 1, 2:
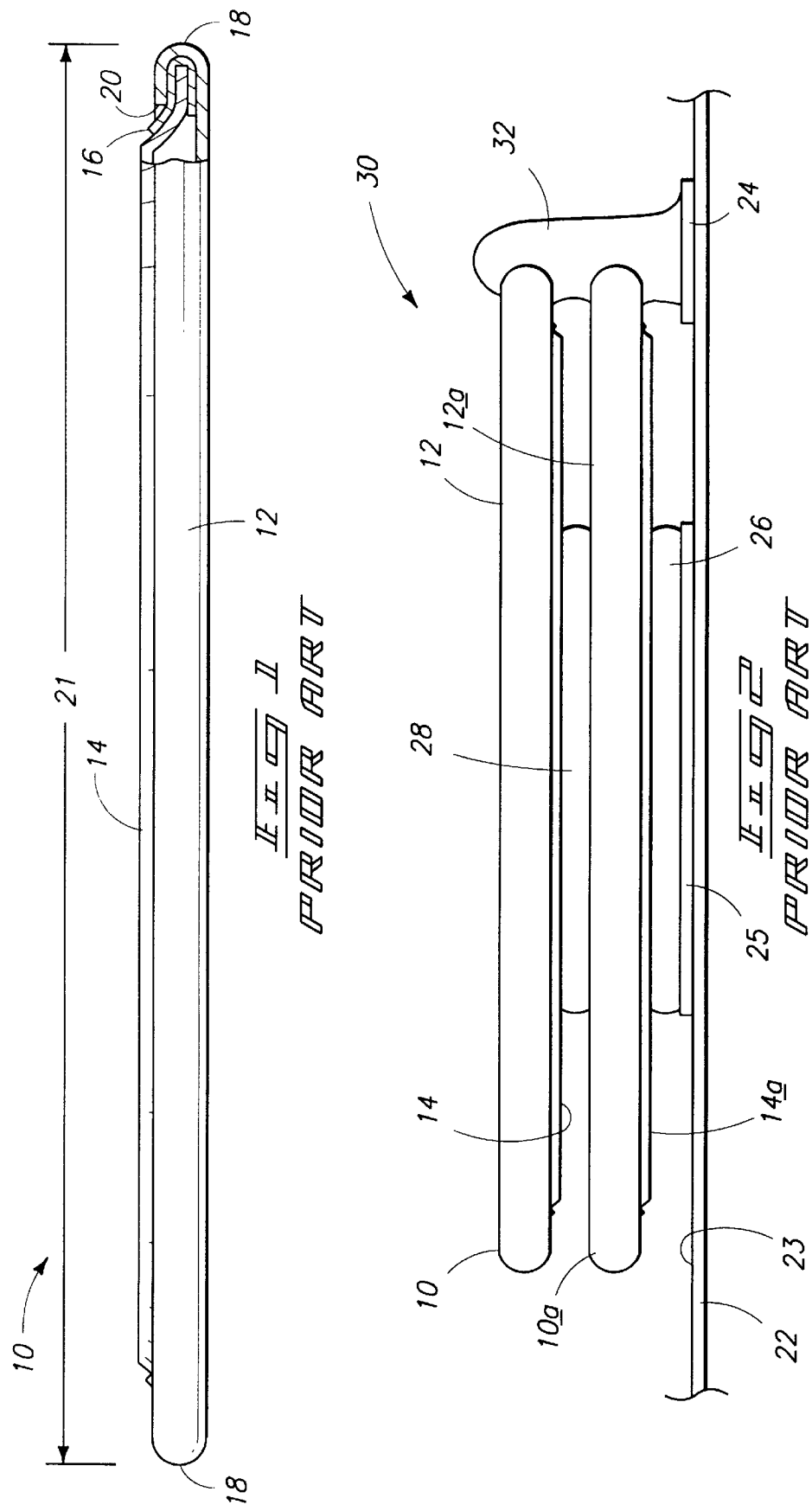
FIG. 1 is a side elevational, partial cross sectional, view of a thin profile battery.
FIG. 2 is a side elevational view of a thin profile battery apparatus operably associated with a battery powerable apparatus, and is reduced in scale compared to the scale of FIG. 1.

This disclosure of the invention is submitted in furtherance of the constitutional purposes of the U.S. Patent Laws "to promote the progress of science and useful arts" (Article 1, Section 8).

Referring to FIG. 1, a single thin-profile battery is indicated generally with reference numeral 10. In the context of this document, "thin profile battery" is intended to define any battery having a thickness dimension which is less than a maximum linear dimension of its anode or cathode. The preferred and illustrated battery 10 comprises a circular button-type battery. Such comprises a lid terminal housing member 14 and a can terminal housing member 12. Can 12 is crimped about lid 14, having an insulative gasket 16 interposed therebetween. In the illustrated example, gasket 16 projects outwardly slightly relative to the crimp as shown. Can 12 defines an outermost edge enveloping battery periphery 18. For purposes of the continuing discussion, can 12 includes an edge terminus 20 which is positioned or received radially inward of outermost battery periphery 18. Battery 10 comprises a largest or maximum linear dimension 21.

In some instances, it is desirable to mount two thin profile batteries in series relative to a substrate. FIGS. 2–4 illustrate an interconnection problem associated with such constructions and two which the invention was principally motivated to overcome. FIG. 2 illustrates a battery powerable apparatus 30 comprising a substrate 22. Such includes an outer surface 23 having one node location 24 and another node location 25 to which battery electrical connection is desired. Substrate 22, for example, can comprise a flexible circuit substrate, wherein nodes 24 and 25 comprise printed thick film ink formed on surface 23. Batteries 10 and 10a are mounted thereover in series and electrically connect with nodes 24 and 25. Specifically, battery 10a underlies battery 10 and is of the same size and shape as battery 10. Battery 10 comprises an outer battery relative to substrate 22, and battery 10a comprises an inner battery relative to substrate 22. Battery 10a has its lid 14a conductively bonded with surface node 25 with a suitable conductive epoxy adhesive 26. An example adhesive is a silver filled conductive epoxy, such as a mixture of Part No. 116-37A and B-187 in a 100:3 weight ratio, respectively, cured at 60° C. for 4 hours, and available from Creative Materials, Inc. of Tyngsboro, Mass. Battery 10 has its lid 14 conductively bonded with conductive epoxy 28 to can 12a of battery 10a.

A conductive epoxy mass 32 is intended to conductively interconnect can 12 of battery 10 with substrate surface node 24 to complete the battery powered connection. Unfortunately as shown, mass 32 can have a tendency to electrically connect with can 12a of battery 10a, thereby creating a fatal short.

FIGS. 3 and 4 illustrate exemplary techniques for avoiding such shorts. Specifically, FIG. 3 illustrates a battery powerable apparatus 31 wherein a single electrically insulative shrink sleeve 27 is formed entirely about the edge peripheries of both batteries 10 and 10a. FIG. 4 illustrates a battery powerable apparatus 34 having a single shrink sleeve 33 formed about battery 10a. In either event, both the FIGS. 3 and FIG. 4 constructions have an outermost battery apparatus periphery which is contacted with some discrete insulating material jacket. Such serve to protect and insulate the outermost periphery of the lower battery from being contacted with an electrical interconnect 35 between can 12 of battery 10 and substrate surface node 24. This construction and processing does, however, have the added drawback of requiring separate fabrication and placement of the respective shrink sleeves. Where apparatus 30, 31 and 34 comprise a radio frequency communication device, such as a remote intelligence communication device (RIC) or a radio frequency identification tag (RFID), such constructions would typically be encapsulated in a protective and insulating epoxy encapsulant.

Referring to FIG. 5, a battery powerable apparatus in accordance with the invention is indicated generally with reference numeral 40. Like numerals from the above-described Figures are utilized where appropriate, with differences being indicated with different numerals. Battery powerable apparatus 40 comprises a thin profile battery apparatus 42 comprising at least two thin profile batteries 10 and 10a conductively bonded to one another, with one of the batteries (in this example battery 10) having a portion 44 which overhangs the other battery (in this example battery 10a). In the illustrated and preferred embodiment, batteries 10 and 10a comprise button-type batteries of substantially the same size and shape. Such batteries are conductively bonded with one another with conductive epoxy 26 and 28 in series electrical connection relative to substrate node 25. Although the invention was principally motivated by problems associated with serial interconnection of such button-type batteries, parallel interconnection is also contemplated in accordance with aspects of the invention. See FIG. 6, for example, showing a thin profile battery apparatus 42a depicting parallel interconnections of a pair of batteries 10 and 10a. Battery apparatus 42 and 42a are ideally fabricated to not include any discrete insulating material jacket contacting the outermost peripheries of either battery 10 or 10a.

In accordance with the preferred embodiment, edge peripheries 18 and 18a of the same or differing size batteries do not laterally coincide. Overhang portion 44 of battery 10 preferably overhangs the other battery 10a by a distance less than or equal to about 90% of largest linear dimension 21 of battery 10. Further, overhang portion 44 overhangs battery 10a by a distance less than or equal to about 90% of largest linear dimension 21a of battery 10a. Further preferably, edge terminus 20 comprises a part of overhanging portion 44.

A conductive interconnection 46, preferably comprising cured electrically conductive epoxy, electrically interconnects and extends between overhang portion 44 of outer battery 10 and substrate surface node location 24. Spacing of interconnection 46 from lower battery can 12a is provided to avoid shorting or provision of some discrete insulating material jacket or sleeve relative to can 12a of battery 10a. Thus, conductive interconnection 46 extends from overhang portion 44 to a location past battery 10a elevationally outermost lid surface 14a, which in this example is to a point below such surface. In the preferred embodiment, all conductive interconnections 26, 28 and 46 comprise cured conductive epoxy.

Apparatus 40 of FIG. 5 might be manufactured in a number of different ways. In one example, the apparatus fabricator might preconstruct or purchase thin profile battery apparatus exemplified by apparatus 42 as preassembled in series or parallel connection with conductive epoxy interconnect 28, or some other conductive interconnect. Such assembly would thereafter be conductively bonded by application of conductive epoxy 26 and 46. Alternately, some conductor 46 or other conductor might be pre-fabricated to constitute a part of assembly 42, with such assembly thereafter being bonded relative to substrate 22. In either such examples, the illustrated two batteries are bonded together with conductive epoxy prior to conductively connecting one of the batteries to node location 25.

As an alternate example, a battery 10a could be initially conductively bonded with substrate node location 25. Thereafter, one or more batteries 10 could be bonded outwardly thereof, with an electrical interconnection 46 thereafter being added. Accordingly in such example, the conductive connection of battery 10a relative to node location 25 would occur before providing battery 10 to overhang battery 10a. Regardless, the preferred technique of conductively supporting thin profile battery apparatus 42 relative to substrate 22 is by providing the illustrated conductive epoxy 26 which in the preferred embodiment provides both an electrical and physical connection.

The preferred overhang 44 of the outer battery relative to the inner battery preferably is provided to place the edge terminus 20 within the overhang portion. Terminus 20 and projecting gasket 16 in the preferred embodiment form a natural barrier for conductive epoxy 46 upon application (such as with a syringe) and before curing to vertically fall off onto node 24 without coming into physical contact with the conductive surface of can 12a of battery 10a.

The above describe embodiments utilized at least two thin profile batteries of the same size and shape. The invention also contemplates use of at least two batteries having at least one of, a) different size, and b) different shape. For example, FIG. 7 illustrates a thin profile battery apparatus 70 comprised of a button type battery 10 and a button type battery 10b. Battery 10b is smaller than battery 10, providing an overhang portion 71.

In one preferred implementation in accordance with the invention, battery powerable apparatus 40 preferably comprises a radio frequency communication device 50 as exemplified in FIG. 8. In such example, substrate 22 preferably comprises a flexible substrate, with nodes 25 and 24 constituting a portion of a series of conductive paths formed of printed thick film ink on the surface of flexible substrate 22. Such conductive paths includes antenna portions 54. At least one, and preferably only one, integrated circuit chip 52 is mounted relative to substrate 22 and in electrical connection with a first portion of the substrate conductive paths. Mounting is preferably with electrically conductive epoxy such as described above. Thin profile battery apparatus 42, comprising at least two thin profile batteries conductively bonded in series with and over one another, is conductively bonded with a second portion of the substrate conductive paths. In this example, such second portion comprises a series of printed thick film nodes 25. The overhang portion of battery apparatus 42 electrically connects with a third portion of the substrate conductive paths, which in this example comprises node 24 in the shape of an arc.

An exemplary single integrated circuit chip is described in U.S. patent application Ser. No. 08/705,043, which names James O'Toole, John R. Tuttle, Mark E. Tuttle, Tyler Lowery, Kevin Devereaux, George Pax, Brian Higgins, Shu-Sun Yu, David Ovard, and Robert Rotzoll as inventors, which was filed on Aug. 29, 1996, and is assigned to the assignee of this patent application. The entire assembly 50 preferably is encapsulated in and comprises an insulative epoxy encapsulant material. Example constructions and methods for providing the same are described in a) U.S. Patent Application entitled "Battery Mounting Apparatuses, Electronic Devices, And Methods Of Forming Electrical Connections", which names Ross S. Dando, Rickie C. Lake, and Krishna Kumar as inventors, and b) U.S. Patent Application entitled "Battery Mounting And Testing Apparatuses, Methods Of Forming Battery Mounting And Testing Apparatuses, Battery-Powered Test-Configured Electronic Devices, And Methods Of Forming Battery-Powered Test-Configured Electronic Devices", which names Scott T. Trosper as inventor, both of which are assigned to the assignee of this patent application, and both of which were filed concurrently with the application which matured into this patent. Each of the above three referenced patent applications is fully incorporated herein by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A thin profile battery apparatus comprising at least two thin profile batteries conductively bonded to one another, one of the batteries including a portion which overhangs the other.

2. The apparatus of claim 1 wherein the two batteries are bonded to one another in series.

3. The apparatus of claim 1 wherein the two batteries are bonded to one another in parallel.

4. The apparatus of claim 1 further comprising a conductor extending from the overhang portion, and spaced from the other battery, to a location past the other battery.

5. The apparatus of claim 1 wherein the one battery includes a largest linear dimension, the overhang portion overhanging the other battery a distance less than or equal to about 90% of the largest linear dimension.

6. The apparatus of claim 1 wherein the other battery includes a largest linear dimension, the overhang portion overhanging the other battery a distance less than or equal to about 90% of the largest linear dimension.

7. The apparatus of claim 1 wherein the thin profile batteries are conductively bonded to one another with conductive epoxy.

8. The apparatus of claim 1 wherein the two thin profile batteries have at least one of, a) different size, and b) different shape.

9. A button type battery apparatus comprising at least two button type batteries conductively bonded to one another, one of the batteries including a portion which overhangs the other.

10. The apparatus of claim 9 wherein the one button type battery comprises a lid and a can, the can being crimped about the lid and defining an outermost battery periphery, and the can having an edge terminus positioned radially inward of the outermost battery periphery, the edge terminus comprising a part of the overhanging portion.

11. The app aratus of claim 9 wherein the two batteries are bonded to one another in series.

12. The apparatus of claim 9 wherein the two batteries are bonded to one another in parallel.

13. The apparatus of claim 9 wherein the two batteries comprise respective outermost peripheries which are not contacted with any discrete insulating material jacket.

14. The apparatus of claim 9 wherein the two batteries comprise respective outermost peripheries which are not contacted with any discrete insulating material jacket; and further comprising a conductor extending from the overhang portion, and spaced from the other battery, to a location past the other battery.

15. The apparatus of claim 9 wherein the two batteries are at least one of, a) different size, and b) different shape.

16. A thin profile battery apparatus comprising:
   a first thin profile battery having an edge enveloping periphery;
   a second thin profile battery having an edge enveloping periphery of substantially the same size and shape as the first thin profile battery edge periphery;
   the first and second thin profile batteries being electrically connected with one another and mounted one over the other with their edge peripheries not laterally coinciding; and
   the first and second thin profile batteries being conductively bonded to one another.

17. A thin profile battery apparatus comprising:
   a first thin profile battery having an edge enveloping periphery;
   a second thin profile battery having an edge enveloping periphery of substantially the same size and shape as the first thin profile battery edge periphery;
   the first and second thin profile batteries being electrically connected with one another and mounted one over the other with their edge peripheries not laterally coinciding; and
   the first and second thin profile batteries being conductively bonded to one another with conductive epoxy.

18. A thin profile battery apparatus comprising:
   a first thin profile battery having an edge enveloping periphery;
   a second thin profile battery having an edge enveloping periphery of substantially the same size and shape as the first thin profile battery edge periphery; and
   the first and second thin profile batteries being electrically connected with one another in parallel and mounted one over the other with their edge peripheries not laterally coinciding.

19. A battery powerable apparatus comprising:
   a substrate having a surface comprising at least one node location;

a stack of at least two thin profile batteries electrically connected with one another and mounted over the substrate, one of the batteries comprising an outer battery relative to the substrate and one of the batteries comprising an inner battery relative to the substrate, the outer battery including a portion which overhangs the inner battery; and a conductive interconnection electrically interconnecting and extending between the overhang portion of the outer battery and the one substrate node location.

20. The apparatus of claim 19 wherein the two thin profile batteries are conductively bonded with one another.

21. The apparatus of claim 19 wherein the two thin profile batteries are button type batteries.

22. The apparatus of claim 19 wherein the inner battery is electrically connected with another node location on the substrate surface.

23. The apparatus of claim 19 wherein the inner battery is conductively bonded with another node location on the substrate surface.

24. The apparatus of claim 19 wherein the inner and outer batteries are electrically connected with one another in series.

25. The apparatus of claim 19 wherein the conductive interconnection is spaced from the inner battery and bonded to the one substrate node location.

26. The apparatus of claim 19 wherein the conductive interconnection comprises conductive epoxy spaced from the inner battery and bonded to the one substrate node location.

27. A battery powerable apparatus comprising:

a substrate having a surface comprising at least two node locations;

a stack of at least two thin profile batteries conductively bonded with one another in series with conductive epoxy, one of the batteries comprising an outer battery relative to the substrate and one of the batteries comprising an inner battery relative to the substrate, the inner battery being conductively bonded with one of the two node locations with conductive epoxy, the outer battery including a portion which overhangs the inner battery, the two thin profile batteries comprising respective outermost peripheries which are not contacted with any discrete insulating material jacket; and a conductive interconnection of conductive epoxy electrically interconnecting and extending between the overhang portion of the outer battery and the one substrate node location, the interconnection being spaced from the inner battery.

28. A radio frequency communication device comprising:

a substrate having conductive paths including an antenna;

at least one integrated circuit chip mounted to the substrate and in electrical connection with a first portion of the substrate conductive paths; and at least two thin profile batteries conductively bonded in series with and over one another and a second portion of the substrate conductive paths, one of the batteries having a portion which overhangs the other and is in electrical connection with a third portion of the substrate conductive paths.

29. The device of claim 28 wherein the chip is conductively bonded to the first portion with conductive epoxy.

30. The device of claim 28 wherein the two thin profile batteries are button type batteries.

31. The device of claim 28 wherein the two thin profile batteries are button type batteries having the same size and shape.

32. The device of claim 28 wherein the two thin profile batteries are button type batteries having at least one of, a) different size, and b) different shape.

33. The device of claim 28 wherein the two thin profile batteries are button type batteries, the one battery comprising a lid and a can, the can being crimped about the lid and defining an outermost battery periphery, and the can having an edge terminus positioned radially inward of the outermost battery periphery, the edge terminus comprising a part of the overhanging portion.

34. The device of claim 28 wherein the two batteries are bonded with conductive epoxy to the second portion of the substrate conductive paths, the overhang portion being electrically connected with the third portion of the substrate conductive paths with conductive epoxy.

35. A method of forming a battery powerable apparatus comprising the following steps:

providing at least two thin profile batteries over one another;

conductively connecting one of the batteries to a first node location formed on a surface of a substrate;

providing the other of the batteries to overhang the one battery and be electrically connected therewith; and conductively interconnecting the overhang of the other battery with a second node location formed on the surface of the substrate.

36. The method of claim 35 wherein the providings occur before conductively connecting the one battery to the first node location.

37. The method of claim 35 wherein the providings comprising conductively bonding the two batteries together with conductive epoxy before conductively connecting the one battery to the first node location.

38. The method of claim 35 wherein the conductively connecting the one battery to the first node location occurs before providing the other of the batteries to overhang the one.

39. The method of claim 35 wherein the conductively interconnecting comprises depositing and curing electrically conductive epoxy between the second node location and the overhang.

40. The method of claim 35 wherein the thin profile batteries comprise button type batteries.

41. The method of claim 35 wherein the other and one batteries are provided electrically connected in series.

42. A method of forming a battery powerable apparatus comprising the following sequential steps:

conductively bonding a first thin profile battery with a second thin profile battery in series electrical connection, the first thin profile battery including a portion which overhangs the second thin profile battery;

conductively supporting the second battery over a substrate; and conductively interconnecting the overhang portion of the first battery with a conductive node on an outer surface of the substrate.

43. The method of claim 42 wherein the conductively supporting comprises bonding the second battery with conductive epoxy to another conductive node on the outer surface of the substrate.

44. The method of claim 42 wherein the conductively interconnecting comprises forming conductive epoxy intermediate the overhang portion and said conductive node.

45. The method of claim 42 wherein the first and second thin profile batteries comprise button type batteries.

* * * * *